(12) United States Patent
    Nakamura et al.

(10) Patent No.: US 10,945,334 B2
(45) Date of Patent: Mar. 9, 2021

(54) WIRING SUBSTRATE

(71) Applicant: IBIDEN CO., LTD., Ogaki (JP)

(72) Inventors: Takenobu Nakamura, Ogaki (JP);
    Takahiro Yamazaki, Ogaki (JP);
    Takashi Yamauchi, Ogaki (JP);
    Toshihide Makino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/828,050

(22) Filed: Mar. 24, 2020

(65) Prior Publication Data
    US 2020/0315012 A1    Oct. 1, 2020

(30) Foreign Application Priority Data
    Mar. 27, 2019   (JP) .............................. JP2019-061832

(51) Int. Cl.
    *H05K 1/02*        (2006.01)
    *H05K 1/11*        (2006.01)
    (Continued)

(52) U.S. Cl.
    CPC .......... *H05K 1/115* (2013.01); *H05K 1/0298* (2013.01); *H05K 3/429* (2013.01); *H05K 3/4644* (2013.01);
    (Continued)

(58) Field of Classification Search
    CPC ...... H05K 1/115; H05K 3/429; H05K 3/4644; H05K 2201/0338; H05K 2201/09827; H05K 3/4602; H05K 3/0094; H05K 2201/09563; H05K 2201/0959; H05K 2201/0257; H05K 2201/096; H05K 2201/0212; H05K 2201/0215;
    (Continued)

(56) References Cited

U.S. PATENT DOCUMENTS

| 6,376,049 B1 * | 4/2002 | Asai ..................... H05K 3/0094 |
| | | 174/250 |
| 6,596,384 B1 * | 7/2003 | Day ..................... H05K 1/0242 |
| | | 174/250 |

(Continued)

FOREIGN PATENT DOCUMENTS

JP          2014-154631 A       8/2014

*Primary Examiner* — Steven T Sawyer
(74) *Attorney, Agent, or Firm* — Oblon, McClelland, Maier & Neustadt, L.L.P.

(57) ABSTRACT

A wiring substrate includes a core layer, first conductor layers including first inner, outer and intermediate conductor layers, second conductor layers including second inner, outer and intermediate conductor layers, and interlayer insulating layers interposed between the first conductor layers and between the second conductor layers. The first and/or second inner conductor layers has a first laminated structure including a metal foil layer and a plating film layer, the first and/or second outer conductor layers has the first laminated structure, the first and/or second intermediate conductor layers has a second laminated structure including a metal foil layer and a plating film layer, and the first and second laminated structures are formed such that a surface of the second laminated structure on a side away from the core layer has unevenness smaller than unevenness of a surface of the first laminated structure on a side away from the core layer.

20 Claims, 6 Drawing Sheets

(51) Int. Cl.
*H05K 3/42* (2006.01)
*H05K 3/46* (2006.01)

(52) U.S. Cl.
CPC ............. *H05K 2201/0338* (2013.01); *H05K 2201/0355* (2013.01); *H05K 2201/09827* (2013.01)

(58) Field of Classification Search
CPC .......... H05K 3/384; H05K 2201/0209; H05K 2201/09536; H05K 3/383; H05K 3/4069; H05K 2201/0347; H05K 3/385; H05K 2201/0355; H05K 1/0298; B32B 3/00; Y10S 428/901; Y10T 428/24917
See application file for complete search history.

(56) References Cited

U.S. PATENT DOCUMENTS

| | | | | |
|---|---|---|---|---|
| 2011/0314666 | A1* | 12/2011 | Harazono | H05K 3/4644 29/832 |
| 2015/0021084 | A1* | 1/2015 | Ko | H05K 3/4652 174/262 |
| 2016/0020163 | A1* | 1/2016 | Shimizu | H01L 23/49822 361/768 |
| 2016/0133555 | A1* | 5/2016 | Nakamura | H05K 3/427 257/774 |
| 2016/0174364 | A1* | 6/2016 | Harkness, Jr. | H05K 1/115 174/257 |

* cited by examiner

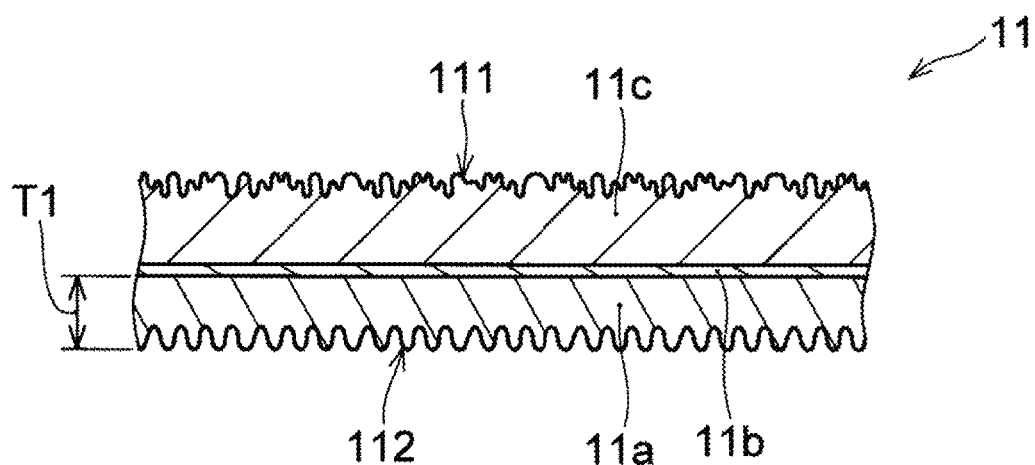
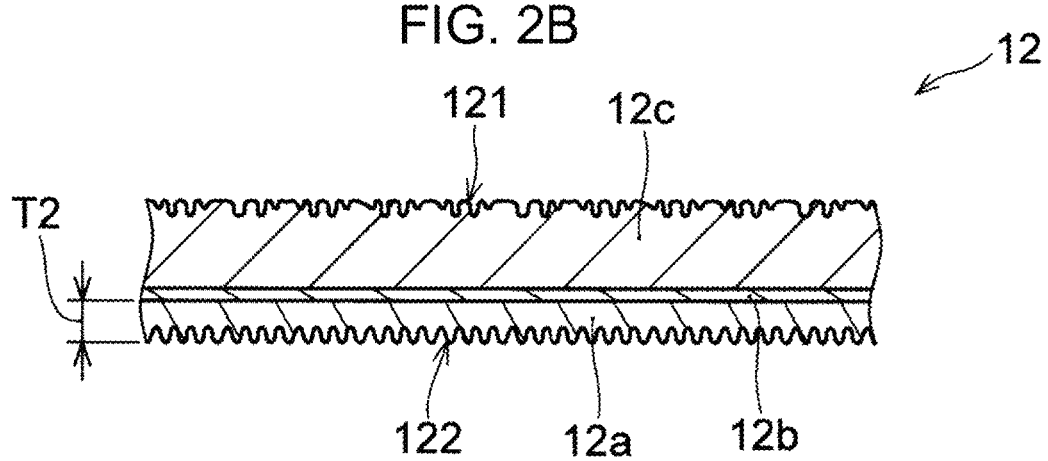

WIRING SUBSTRATE

CROSS-REFERENCE TO RELATED APPLICATIONS

The present application is based upon and claims the benefit of priority to Japanese Patent Application No. 2019-061832, filed Mar. 27, 2019, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-154631 describes a multilayer wiring board in which multiple interlayer resin insulating layers and multiple wiring pattern layers are laminated, and patterns of adjacent wiring pattern layers are connected to each other by via holes. The wiring pattern layers are formed together with the via holes by electroless plating and electrolytic plating. The entire contents of this publication are incorporated herein by reference.

SUMMARY OF THE INVENTION

According to one aspect of the present invention, a wiring substrate includes a core layer, first conductor layers formed on a first surface of the core layer and including a first inner conductor layer formed on the first surface of the core layer, a first outer conductor layer forming an outermost conductor layer on a first surface side of the core layer, and a first intermediate conductor layer formed between the first inner conductor layer and the first outer conductor layer, second conductor layers formed on a second surface of the core layer on the opposite side with respect to the first surface of the core layer and including a second inner conductor layer formed on the second surface of the core layer, a second outer conductor layer forming an outermost conductor layer on a second surface side of the core layer, and a second intermediate conductor layer formed between the second inner conductor layer and the second outer conductor layer, and interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer. At least one of the first and second inner conductor layers has a first laminated structure including a metal foil layer and a plating film layer, at least one of the first and second outer conductor layers has the first laminated structure, at least one of the first and second intermediate conductor layers has a second laminated structure including a metal foil layer and a plating film layer, and the first and second laminated structures are formed such that a surface of the second laminated structure on a side away from the core layer has an unevenness that is smaller than an unevenness of a surface of the first laminated structure on a side away from the core layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is an enlarged view of a first laminated structure of a conductor layer illustrated in FIG. 1;

FIG. 2B is an enlarged view of a second laminated structure of a conductor layer illustrated in FIG. 1;

DETAILED DESCRIPTION OF THE EMBODIMENTS

Figure 1:
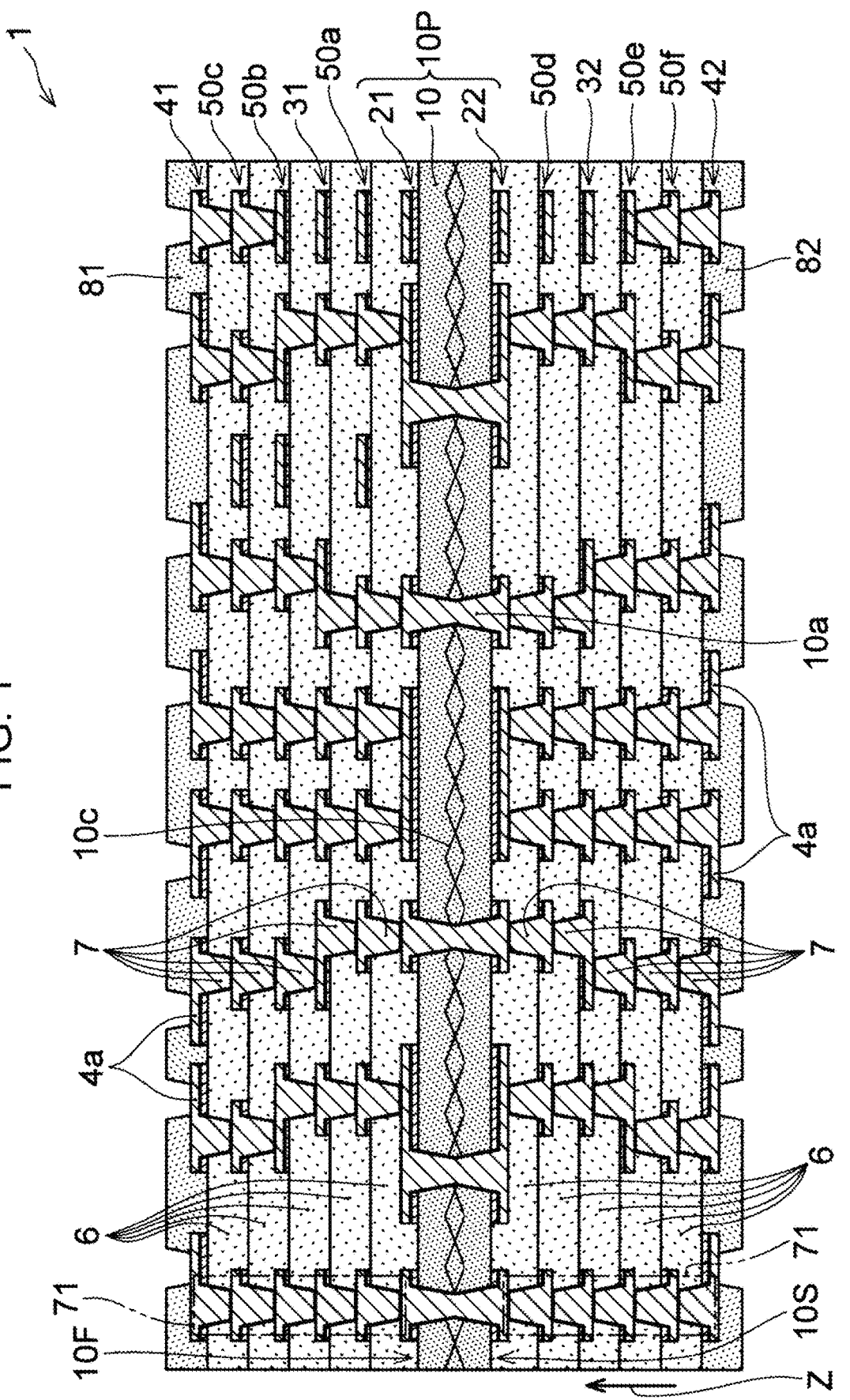
FIG. 1 is a cross-sectional view illustrating an example of a wiring substrate of an embodiment of the present invention.

Embodiments will now be described with reference to the accompanying drawings, wherein like reference numerals designate corresponding or identical elements throughout the various drawings.

Next, a wiring substrate of an embodiment of the present invention is described with reference to the drawings. FIG. 1 illustrates a cross-sectional view of a wiring substrate 1 which is an example of the wiring substrate of the embodiment. As illustrated in FIG. 1, the wiring substrate 1 includes a core layer 10 having a first surface (10F) and a second surface (10S) on an opposite side with respect to the first surface (10F), a first inner conductor layer 21 formed on the first surface (10F) of the core layer 10, and a second inner conductor layer 22 formed on the second surface (10S) of the core layer 10. The core layer 10 is formed using an insulating material. The core layer 10 and the first and second inner conductor layers (21, 22) form a core substrate (10P). Multiple conductor layers and multiple interlayer insulation layers are formed on each of a first surface (10F) side and a second surface (10S) side of the core substrate (10P). That is, the wiring substrate 1 further includes a first outer conductor layer 41 formed on an outermost layer on the first surface (10F) side of the core layer 10, a second outer conductor layer 42 formed on an outermost layer on the second surface (10S) side of the core layer 10, a first intermediate conductor layer 31 formed between the first inner conductor layer 21 and the first outer conductor layer 41, and a second intermediate conductor layer 32 formed between the second inner conductor layer 22 and the second outer conductor layer 42. Further, the wiring substrate 1 includes interlayer insulating layers 6 respectively interposed between the first inner conductor layer 21 and the first intermediate conductor layer 31, between the second inner conductor layer 22 and the second intermediate conductor layer 32, between the first intermediate conductor layer 31 and the first outer conductor layer 41, and, between the second intermediate conductor layer 32 and the second outer conductor layer 42.

The wiring substrate 1 of the embodiment illustrated in FIG. 1 further includes three conductor layers on each of the first surface (10F) side and the second surface (10S) side of the core layer 10. That is, the wiring substrate 1 in the example of FIG. 1 includes an inner-layer conductor layer (50a) between the first inner conductor layer 21 and the first intermediate conductor layer 31, and includes two inner-layer conductor layers (50b, 50c) between the first intermediate conductor layer 31 and the first outer conductor layer 41. Further, the wiring substrate 1 includes an inner-layer conductor layer (50d) between the second inner conductor layer 22 and the second intermediate conductor layer 32, and includes two inner-layer conductor layers (50e, 50f) between the second intermediate conductor layer 32 and the second outer conductor layer 42. The interlayer insulating layers 6 are respectively provided between the inner-layer conductor layers (50a-50f) and the conductor layers that are respectively adjacent to the inner-layer conductor layers. A build-up layer on the first surface (10F) side is formed by the inner-layer conductor layers (50a-50c), the first intermediate conductor layer 31, the first outer conductor layer 41, and the interlayer insulating layers 6 formed on the first surface (10F) side of the core layer 10. Similarly, a build-up layer on the second surface (10S) side is formed by the inner-layer conductor layers (50d-50f), the second intermediate conductor layer 32, the second outer conductor layer 42, and the interlayer insulating layers 6 formed on the second surface (10S) side of the core layer 10.

The wiring substrate 1 illustrated in FIG. 1 include 12 conductor layers in total. However, the number of the conductor layers of the wiring substrate of the present embodiment is not limited to 12. The wiring substrate 1 can include an arbitrary number of three or more of conductor layers on each of the first surface (10F) side and the second surface (10S) side of the core layer 10. For example, the wiring substrate 1 can include an arbitrary number of 1 or more of inner-layer conductor layers such as the inner-layer conductor layers (50a-50f) between the first inner conductor layer 21 and the first intermediate conductor layer 31 and/or between the first intermediate conductor layer 31 and the first outer conductor layer 41. In the following description, when it is not necessary to distinguish between the inner-layer conductor layers (50a-50f), the inner-layer conductor layers (50a-50f) are also referred to as "the inner-layer conductor layers 50."

Among the conductor layers included in the wiring substrate 1, the "inner-layer conductor layers" are conductor layers formed anywhere between the first inner conductor layer 21 and the first intermediate conductor layer 31, between the first intermediate conductor layer 31 and the first outer conductor layer 41, between the second inner conductor layer 22 and the second intermediate conductor layer 32, and between the second intermediate conductor layer 32 and the second outer conductor layer 42.

Here, the first intermediate conductor layer 31 is a conductor layer formed between the first inner conductor layer 21 and the first outer conductor layer 41, and has a second laminated structure to be described later. Therefore, in the present embodiment, any conductor layer having the second laminated structure interposed between the first inner conductor layer 21 and the first outer conductor layer 41 can be identified as the first intermediate conductor layer 31. Then, other than the identified first intermediate conductor layer 31, conductor layers formed between the first inner conductor layer 21 and the first outer conductor layer 41 are referred to as "inner-layer conductor layers."

Similarly, any conductor layer having the second laminated structure interposed between the second inner conductor layer 22 and the second outer conductor layer 42 can be identified as the second intermediate conductor layer 32. Then, other than the identified second intermediate conductor layer 32, conductor layers formed between the second inner conductor layer 22 and the second outer conductor layer 42 are referred to as "inner-layer conductor layers."

Therefore, the "intermediate" in the "first intermediate conductor layer 31" and the "second intermediate conductor layer 32" does not necessarily mean a center of a distance between the first or second inner conductor layer (21, 22) and the first or second outer conductor layer (41, 42). That is, the first intermediate conductor layer 31 is provided between the first inner conductor layer 21 and the first outer conductor layer 41, and does not necessarily have to be at a middle position between the first inner conductor layer 21 and the first outer conductor layer 41 in a thickness direction of the wiring substrate 1. Further, the first intermediate conductor layer 31 does not necessarily have to be, for example, a middle layer among the multiple conductor layers provided between the first inner conductor layer 21 and the first outer conductor layer 41. The same also applies to the second intermediate conductor layer 32. Therefore, for example, in the laminated structure illustrated in FIG. 1, it is also possible that the first intermediate conductor layer 31 is provided at the position of the inner-layer conductor layer (50c), or the second intermediate conductor layer 32 is provided at the position of the inner-layer conductor layer (50d).

In the description of the wiring substrate 1, a side farther from the core layer 10 in the thickness direction of the wiring substrate 1 is also referred to as an "upper side" or simply "upper," and a side closer to the core layer 10 is also referred to as a "lower side" or simply "lower." Further, for the conductor layers, conductor patterns included in the conductor layers, and the interlayer insulating layers, a surface facing an opposite side with respect to the core layer 10 is also referred to as an "upper surface," and a surface facing the core layer 10 is also referred to as a "lower surface." Further, the thickness direction of the wiring substrate 1 is also simply referred to as a "Z direction."

The wiring substrate 1 of FIG. 1 further includes through-hole conductors (10a) provided in the core layer 10 and via conductors 7 provided in the interlayer insulating layers 6. The through-hole conductors (10a) penetrate the core layer 10 and connect the first inner conductor layer 21 and the second inner conductor layer 22 to each other. The via conductors 7 respectively penetrate the interlayer insulating layers 6 that respectively include the via conductors 7, and connect to each other adjacent conductor layers via the interlayer insulating layers 6 (for example, connect to each other the first outer conductor layer 41 and the inner-layer conductor layer (50c)).

The first outer conductor layer 41 and the second outer conductor layer 42 include connection pads (4a) on which electronic components (not illustrated in the drawings) are to be mounted. The wiring substrate 1 in FIG. 1 further includes a solder resist layer 81 formed on the first outer conductor layer 41, and a solder resist layer 82 formed on the second outer conductor layer. The solder resist layers (81, 82) have openings that respectively expose the connection pads (4a). The solder resist layers (81, 82) are each formed using, for example, an epoxy resin, a polyimide resin, or the like.

The core layer 10 and the interlayer insulating layers 6 are each formed using any insulating material. Examples of the insulating material include an epoxy resin, a bismaleimide triazine resin (BT resin), a phenol resin, and the like. The insulating layers formed using these resins may each contain a reinforcing material such as a glass fiber or an aramid fiber, and/or inorganic filler such as silica. In the example of FIG. 1, the core layer 10 contains a reinforcing material (10c). Although not illustrated in the drawings, some or all of the multiple interlayer insulating layers 6 may each contain a reinforcing material.

The via conductors 7 are so-called filled vias formed by filling through holes penetrating the interlayer insulating layers 6 with conductors. Each of the via conductors 7 is integrally formed with a conductor layer on an upper side thereof. For example, the via conductors 7 formed directly below the first outer conductor layer 41 are formed together and integrally with the first outer conductor layer 41. The via conductors 7 for each formed by, for example, an electroless plating film and an electrolytic plating film of copper, nickel, or the like. The through-hole conductors (10a) are also each formed by an electroless plating film and an electrolytic plating film of copper, nickel, or the like. The through-hole conductors (10a) are formed together and integrally with the first and second inner conductor layers (21, 22).

The via conductors 7 each have a tapered shape that is reduced in diameter toward the core layer 10 in the Z direction. Further, in the example of FIG. 1, each of the through-hole conductors (10a) is reduced in diameter from the first surface (10F) and the second surface (10S) of the core layer 10 toward a center part of the each of the through-hole conductors (10a) in the Z direction, and has a neck part at the center part in the Z direction where a cross-sectional area of the each of the through-hole conductors (10a) becomes smallest. Although the term "reduced in diameter" is used for convenience, the via conductors 7 and the through-hole conductors (10a) are not limited to each have a circular or elliptical cross-sectional shape perpendicular to the Z direction.

In the example of FIG. 1, as illustrated on the left side of FIG. 1, the wiring substrate 1 includes stacked via conductors 71. The stacked via conductors 71 are each formed by a stack of via conductors 7 formed at positions overlapping each other in a plan view in the interlayer insulating layers 6. By two stacked via conductors 71 and a through-hole conductor (10a), the first outer conductor layer 41 and the second outer conductor layer 42 are electrically connected to each other through a substantially shortest path and are connected to the other conductor layers.

The first and second inner conductor layers (21, 22), the first and second intermediate conductor layers (31, 32), the first and second outer conductor layers (41, 42), and the inner-layer conductor layers (50a-50f) can each be formed, for example, using any metal such as copper, nickel, silver, or palladium alone or using two or more of these metals in combination. However, these conductor layers can have different structures from each other. With reference to FIGS. 2A and 2B, laminated structures (first and second laminated structures) of the conductor layers are described below.

FIG. 2A illustrates an example of a first laminated structure 11 formed in at least one of the first and second inner conductor layers (21, 22) and the first and second outer conductor layers (41, 42) in the present embodiment. In the above-referred example of FIG. 1, all the first inner conductor layer 21, the second inner conductor layer 22, the first outer conductor layer 41, and the second outer conductor layer 42 have the first laminated structure 11. As illustrated in FIG. 2A, the first laminated structure 11 includes at least a metal foil layer (11a) having a predetermined thickness (T1), and plating film layer (11c). The first laminated structure 11 of FIG. 2A further includes an intermediate metal layer (11b) between the metal foil layer (11a) and the plating film layer (11c). The conductor layers having the first laminated structure 11 are patterned using, for example, a subtractive method.

The metal foil layer (11a) is, for example, formed of a metal foil containing copper, nickel, or the like as a main material. The plating film layer (11c) is, for example, a plating film formed by electrolytic plating, and a material thereof is, for example, copper, nickel, or the like. The intermediate metal layer (11b) is used as a seed layer that can also function as an electrode when the plating film layer (11c) is formed by electrolytic plating. A material of the intermediate metal layer (11b) is, for example, copper, nickel, or the like. The intermediate metal layer (11b) is formed, for example, by electroless plating or sputtering. In the conductor layers having the first laminated structure 11, the metal foil layer (11a) faces toward a lower side (the core layer 10 side).

FIG. 2B illustrates an example of a second laminated structure 12 of the first intermediate conductor layer 31 and the second intermediate conductor layer 32. As illustrated in FIG. 2B, the second laminated structure 12 includes at least a metal foil layer (12a) and a plating film layer (12c), the metal foil layer (12a) having a thickness (T2) which is smaller than the predetermined thickness (T1) of the metal foil layer (11a) of the above-described first laminated structure 11. The second laminated structure 12 of FIG. 2B further includes an intermediate metal layer (12b) between the metal foil layer (12a) and the plating film layer (12c). As compared to a conductor layer having the first laminated structure 11, a conductor pattern can be formed at a fine pitch in a conductor layer having the second laminated structure 12 that includes the metal foil layer (12a) thinner than the metal foil layer (11a) of FIG. 2A. A conductor pattern having the second laminated structure 12 can be formed, for example, using a semi-additive method using a metal foil (so-called MSAP method: Modified Semi Additive Process).

Similar to the metal foil layer (11a) of the first laminated structure 11, the metal foil layer (12a) is formed of a metal foil containing copper, nickel, or the like as a main material. Similar to the intermediate metal layer (11b) of the first laminated structure 11, the intermediate metal layer (12b) is formed, for example, by electroless plating or sputtering using copper, nickel, or the like, and can function as a seed layer in forming the plating film layer (12c). Then, the plating film layer (12c) is preferably formed by electrolytic plating using, for example, copper, nickel, or the like. In the conductor layers having the second laminated structure 12, the metal foil layer (12a) faces toward a lower side (the core layer 10 side).

Referring to both FIGS. 2A and 2B, a surface 121 on the plating film layer (12c) side of the second laminated structure 12 is smoother than a surface 111 on the plating film layer (11c) side of the first laminated structure 11, and the unevenness of the surface 121 is smaller and/or finer than the unevenness of the surface 111. Therefore, the surface (on an opposite side with respect to the core layer 10) of each of the conductor layers (the first and second intermediate conductor layers (31, 32)) having the second laminated structure 12 has a higher smoothness than the surface (on an opposite side with respect to the core layer 10) of each of the conductor layers (the first and second inner conductor layers (21, 22) and/or the first and second outer conductor layers (41, 42)) having the first laminated structure 11.

The first intermediate conductor layer 31 and the second intermediate conductor layer 32 illustrated in FIG. 1 have the second laminated structure 12 which has such a feature regarding the unevenness of the surface 121. In the present embodiment, the first intermediate conductor layer 31 and the second intermediate conductor layer 32 are each a conductor layer formed between the interlayer insulating layers 6. Since the first intermediate conductor layer 31 and the second intermediate conductor layer 32 have the second laminated structure 12, it is thought that a short circuit failure between each of the intermediate conductor layers (31, 32) and any adjacent conductor layer thereabove is unlikely to occur. It is thought that this can contribute to improving the quality of the wiring substrate.

On the other hand, as described above, the first and second outer conductor layers (41, 42) having the first laminated structure 11 each have connection pads (4a), and an electronic component (not illustrated in the drawings) is mounted on the connection pads (4a). The electronic component is mounted on surfaces (on an opposite side with respect to the core layer 10) of the connection pads (4a), that is, the electronic component is mounted on the surface 111 of the first laminated structure 11 illustrated in FIG. 2A. In the above-referred example of FIG. 1, the first and second outer conductor layers (41, 42) have the first laminated structure 11, and the surface 111 of the first laminated structure 11 has a relatively large roughness. Therefore, an actual bonding interface between a bonding material such as solder used for mounting the electronic component and the connection pads (4a) is relatively large. Therefore, it is thought that the electronic component is firmly connected to the connection pads (4a).

Further, referring to both FIGS. 2A and 2B, a surface 112 on the metal foil layer (11a) side of the first laminated structure 11 has a larger unevenness than a surface 122 on the metal foil layer (12a) side of the second laminated structure 12, and the surface 112 has a larger surface roughness than the surface 122. Therefore, the surface on the core layer 10 (see FIG. 1) side of each of the first and second inner conductor layers (21, 22) and/or the first and second outer conductor layers (41, 42) has a larger unevenness than the surface on the core layer 10 side of each of the first and second intermediate conductor layers (31, 32).

Along with the mounting of the above-described electronic component, a stress that can cause interfacial peeling can occur at interfaces between the first and second outer conductor layers (41, 42) and the interlayer insulating layers 6. When the first and second outer conductor layers (41, 42) have the first laminated structure 11 as in the example of FIG. 1, the first and second outer conductor layers (41, 42) have relatively large surface unevenness on the core layer 10 side. Therefore, the first and second outer conductor layers (41, 42) and the interlayer insulating layers 6 can firmly adhere to each other due to a so-called anchor effect. Therefore, it is thought that interfacial peeling is unlikely to occur.

Further, the thickness (T1) of the metal foil layer (11a) of the first laminated structure 11 is larger than the thickness (T2) of the metal foil layer (12a). Therefore, in the example of FIG. 1, diffusion of solder supplied to the connection pads (4a) into the connection pads (4a) is thought to be relatively difficult to reach interfaces between the first or second outer conductor layer (41, 42) and the interlayer insulating layers 6. Therefore, it is thought that a decrease in adhesion strength at the interfaces is unlikely to occur.

A maximum height difference of the unevenness of the surface 111 of the first laminated structure 11 is, for example, 1.5 μm or more and 5.0 μm or less. On the other hand, a maximum height difference of the unevenness of the surface 121 of the second laminated structure 12 is, for example, 0.3 μm or more and 1.0 μm or less.

The thickness (T1) of the metal foil layer (11a) of the first laminated structure 11 is, for example, about 3 μm or more and 15 μm or less. However, the thickness (T1) is not limited to this example. The thickness (T2) of the metal foil layer (12a) of the second laminated structure 12 is, for example, about 0.5 μm or more and 3 μm or less. However, the thickness (T2) is not limited to this example.

A thickness of each of the first and second inner conductor layers (21, 22), the first and second intermediate conductor layers (31, 32), and the first and second outer conductor layers (41, 42) is, but not limited to, for example, about 10 μm or more and 40 μm or less. The thickness (T1) of the metal foil layer (11a) included in the first laminated structure 11 is larger than the thickness (T2) of the metal foil layer (12a) included in the second laminated structure 12. Therefore, from a point of view of ensuring a desired thickness for each of the conductor layers, the plating film layer (11c) included in the first laminated structure 11 may have a smaller thickness than the plating film layer (12c) included in the second laminated structure 12.

In the wiring substrate of the embodiment, the inner-layer conductor layers 50 may have either the first laminated structure 11 illustrated in FIG. 2A or the second laminated structure 12 illustrated in FIG. 2B. In the example of FIG. 1, the inner-layer conductor layers (50a, 50b, 50d, 50e) have the second laminated structure 12, and the inner-layer conductor layers (50c, 50f) have the first laminated structure 11.

Figure 3:
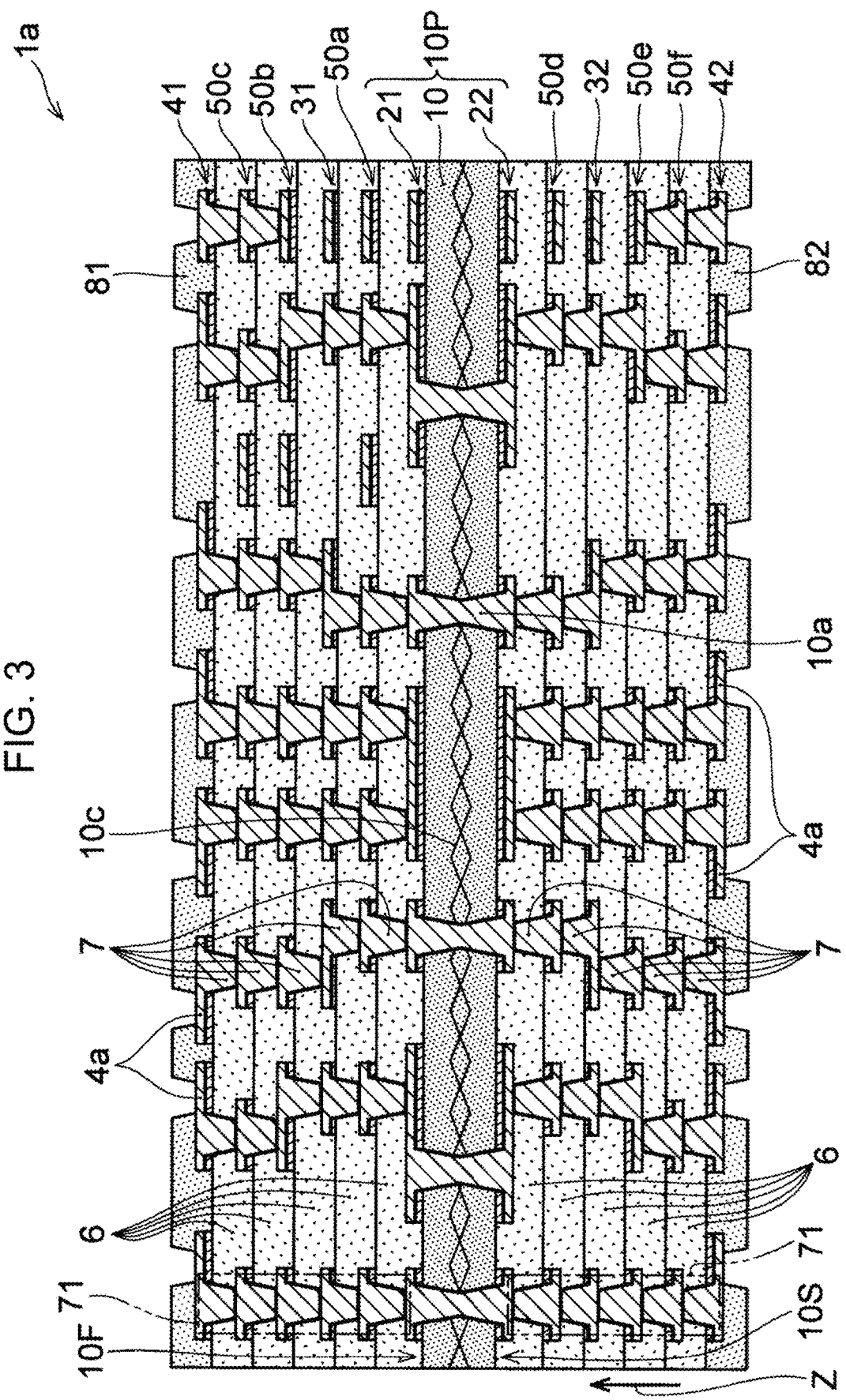
FIG. 3 is a cross-sectional view illustrating another example of a wiring substrate of the embodiment of the present invention.
Figure 4:
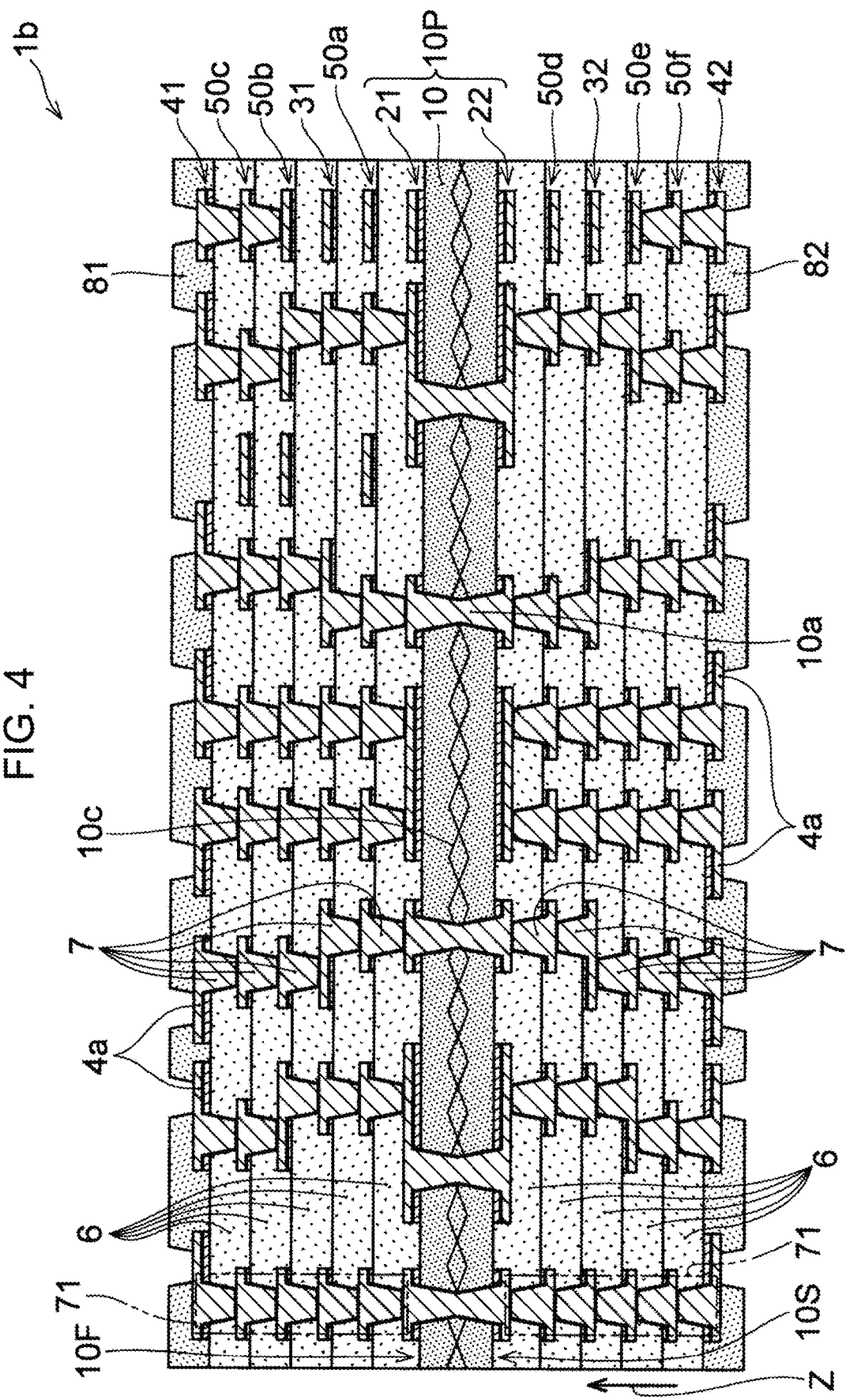
FIG. 4 is a cross-sectional view illustrating still another example of a wiring substrate of the embodiment of the present invention.

Further, in the wiring substrate of the embodiment, unlike the wiring substrate 1 of the example of FIG. 1, all the inner-layer conductor layers may have the same structure as each other. That is, all the conductor layers formed between the first inner conductor layer 21 and the first outer conductor layer 41 except for the first intermediate conductor layer 31, and, all the conductor layers formed between the second inner conductor layer 22 and the second outer conductor layer 42 except for the second intermediate conductor layer 32, may have the same structure as each other. FIGS. 3 and 4 illustrate other examples (wiring substrates (1a, 1b)) of the wiring substrate of the embodiment including such inner-layer conductor layers (50a-50f).

In the wiring substrate (1a) illustrated in FIG. 3, all the inner-layer conductor layers (50a-50f), including the inner-layer conductor layers (50a, 50b, 50d, 50e) (which have the second laminated structure in the wiring substrate 1 of FIG. 1), have the same first laminated structure as the first and second outer conductor layers (41, 42).

In the wiring substrate (1b) illustrated in FIG. 4, all the inner-layer conductor layers (50a-50f), including the inner-layer conductor layers (50c, 50f) (which have the first laminated structure in the wiring substrate 1 of FIG. 1), have the same second laminated structure as the first and second intermediate conductor layers (31, 32). Therefore, in the wiring substrate (1b) of FIG. 4, all the conductor layers formed between the first inner conductor layer 21 and the first outer conductor layer 41 and between the second inner conductor layer 22 and the second outer conductor layer 42 have the second laminated structure. Configuration elements other than the inner-layer conductor layers (50a-50f) in the wiring substrates (1a, 1b) illustrated in FIGS. 3 and 4 are the same as those in the wiring substrate 1 of FIG. 1. Therefore, the configuration elements that are the same as those in the wiring substrate 1 of FIG. 1 are denoted using the same reference numeral symbols as in FIG. 1, and repeated description is omitted.

The inner-layer conductor layers included in the wiring substrate of the present embodiment may have a structure other than any one of the first and second laminated structures. For example, the inner-layer conductor layers (50a-50f) of FIG. 1 may each have a laminated structure (third laminated structure) (not illustrated in the drawings) that includes a single-layer or multi-layer plating film and/or sputtering film without including a metal foil layer. The third laminated structure (not illustrated in the drawings) can include, for example, an underlayer that can be formed using the same material and manufacturing method as the intermediate metal layer (12b) in the example of FIG. 2B, and a plating film layer that can be formed using the same material and manufacturing method as the plating film layer (12c) in the example of FIG. 2B. As compared to a conductor layer having the first or second laminated structure, a conductor pattern can be formed at a fine pitch in a conductor layer having the third laminated structure that does not include a metal foil layer.

Figure 5:
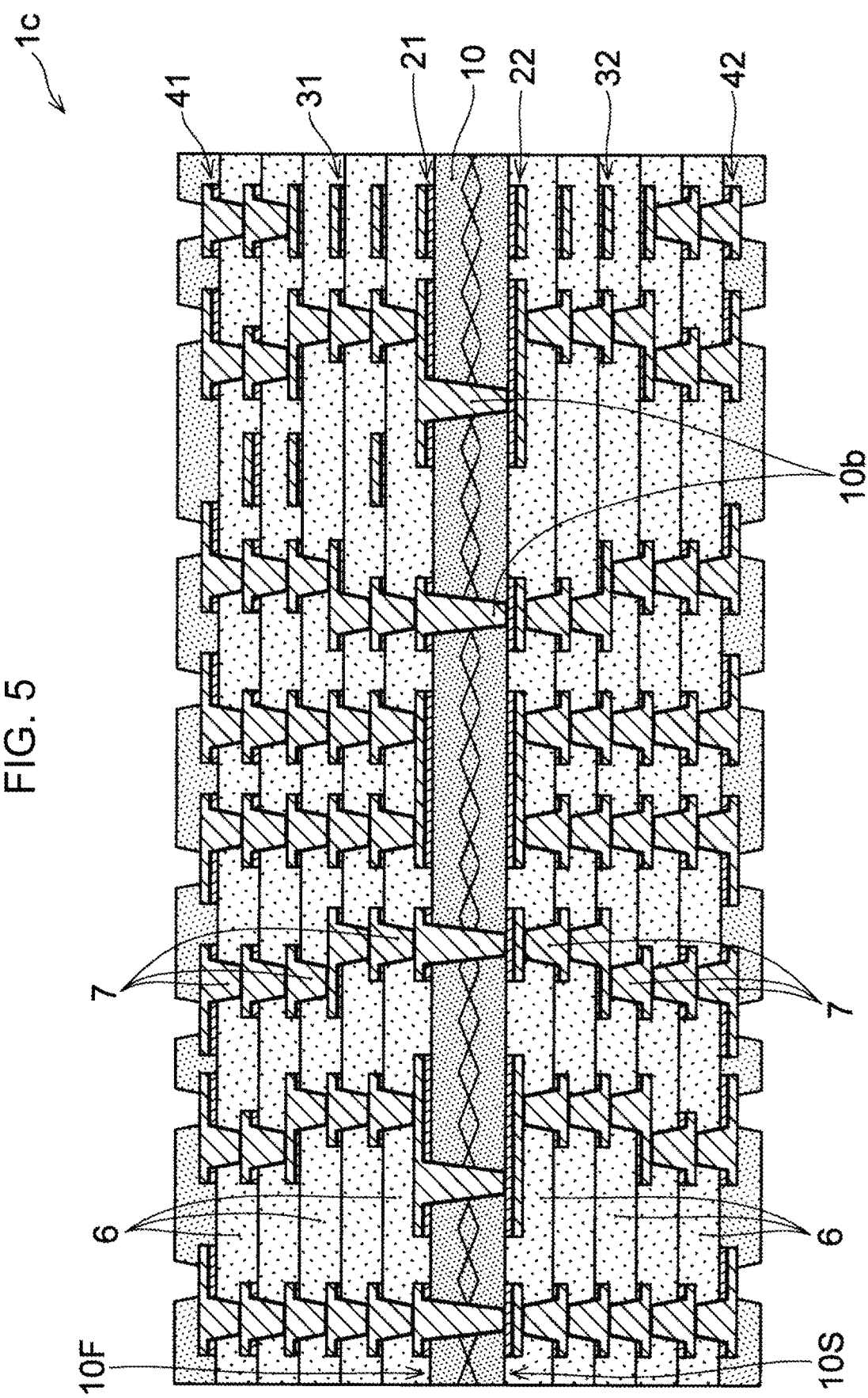
FIG. 5 is a cross-sectional view illustrating yet another example of a wiring substrate of the embodiment of the present invention.

FIG. 5 illustrates a cross-sectional view of a wiring substrate (1c) which is yet another example of the wiring substrate of the present embodiment. Instead of the through-hole conductors (10a) illustrated in FIG. 1, the wiring substrate (1c) includes via conductors (10b) each of which penetrates the core layer 10 while being reduced in diameter toward only one direction. That is, the via conductors (10b) do not each have a neck portion that the through-hole conductors (10a) illustrated in FIG. 1 each have. The via conductors (10b) in the example of FIG. 5 are each reduced in diameter from the first surface (10F) side toward the second surface (10S) side of the core layer 10. Further, the via conductors (10b) in the example of FIG. 5 are integrally formed only with the first inner conductor layer 21. That is, the via conductors (10b) are bottomed via conductors similar to the via conductors 7. The wiring substrate of the embodiment may include the bottomed via conductors (10b) in the core layer 10 as in the wiring substrate (1c) of FIG. 5. The wiring substrate (1c) of FIG. 5 includes the same configuration elements as the wiring substrate 1 in the example of FIG. 1 except that the via conductors (10b) that are each reduced in diameter toward only one direction are formed in the core layer 10. Description about the same configuration elements is omitted.

An example of a method for manufacturing the wiring substrate 1 illustrated in FIG. 1 is described below with reference to FIGS. 6A-6C.

Figure 6A:
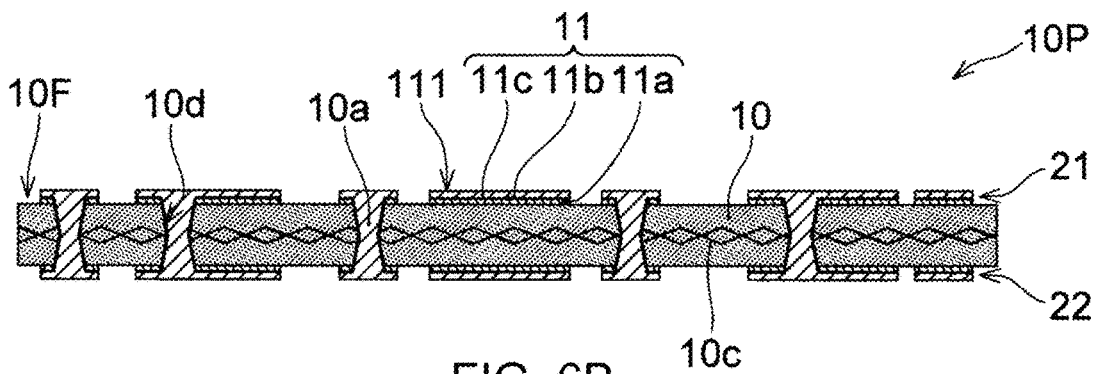
FIG. 6A is a cross-sectional view illustrating an example of a manufacturing process of the wiring substrate of the embodiment.

As illustrated in FIG. 6A, the core substrate (10P) is formed. For example, a laminated plate (for example, a double-sided copper-clad laminated plate) having the core layer 10 and metal foils respectively provided on both sides of the core layer 10 is prepared, the core layer 10 being formed of an insulating resin such as an epoxy resin and containing the reinforcing material (10c). Then, for example, using a subtractive method, the first inner conductor layer 21, the second inner conductor layer 22, and the through-hole conductors (10a) are formed, and the first and second inner conductor layers (21, 22) are patterned to have desired conductor patterns. When holes (10d) for connecting the first inner conductor layer 21 and the second inner conductor layer 22 to each other are formed in the core layer 10, by irradiating laser, for example, from both side of the core layer 10, the through-hole conductors (10a) having the shapes illustrated in FIGS. 1 and 6A can be formed. Further, by irradiating laser from only one side, for example, the first surface (10F) side of the core layer 10 to form bottomed holes, the via conductors (10b) illustrated in FIG. 5 are formed.

In manufacturing the wiring substrate 1 in the example of FIG. 1, the first and second inner conductor layers (21, 22) are formed to have the first laminated structure 11. That is, the metal foils that are respectively provided on the both sides of the core layer 10 each form a metal foil layer (11a), and a seed layer formed by electroless plating for forming the through-hole conductors (10a) forms an intermediate metal layer (11b). Then, an electrolytic plating film formed on the seed layer forms a plating film layer (11c).

When the first and second inner conductor layers (21, 22) are formed using a subtractive method, a surface of the plating film layer (11c) is covered with an etching mask when the first and second inner conductor layers (21, 22) are patterned. That is, the surface of the plating film layer (11c) is not exposed to an etching solution. Therefore, in the wiring substrate 1 of FIG. 1, unevenness formed during film formation by electrolytic plating remains in a surface (on an opposite side with respect to the core layer 10) of each of the first and second inner conductor layers (21, 22) having the first laminated structure 11 (the surface 11l on the plating film layer (11c) side).

Figure 6B:
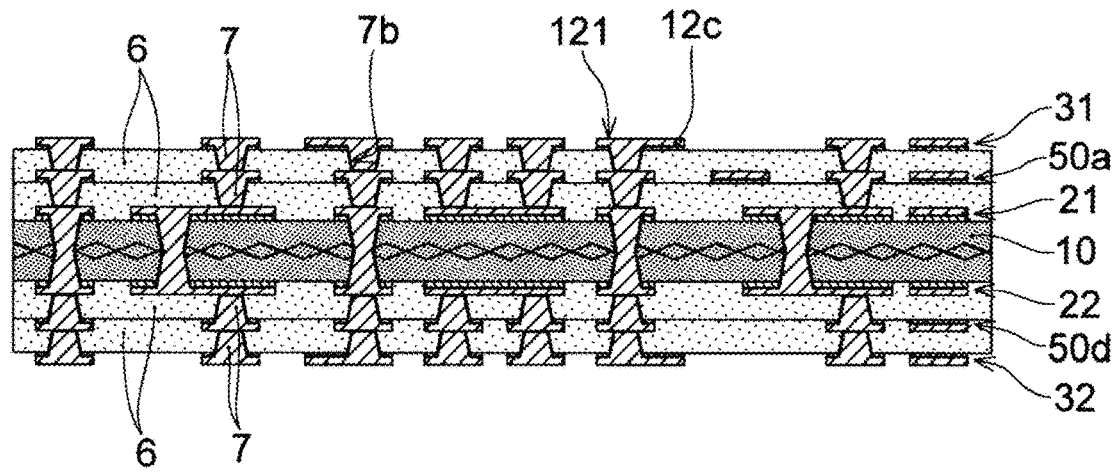
FIG. 6B is a cross-sectional view illustrating an example of a manufacturing process of the wiring substrate of the embodiment.

As illustrated in FIG. 6B, the interlayer insulating layers 6 and the conductor layers are alternately formed on both sides of the core layer 10 and the via conductors 7 are formed in the interlayer insulating layers 6. FIG. 6B illustrates an example of a state in which the formation of the first and second intermediate conductor layers (31, 32) has been completed.

The first and second intermediate conductor layers (31, 32) are formed to have the second laminated structure. In manufacturing the wiring substrate 1 in the example of FIG. 1, the inner-layer conductor layers (50a, 50d) are also formed to have the second laminated structure. An example of a method for forming the conductor layers having the second laminated structure is a semi-additive method using a metal foil. That is, for example, on an already formed conductor layer, a sheet-like prepreg and a metal foil (which will become the metal foil layer of the second laminated structure) are sequentially laminated and thermocompression-bonded, and an interlayer insulating layer 6 is formed. For this metal foil, a metal foil thinner than the metal foil used in forming the first and second inner conductor layers (21, 22) having the first laminated structure in the wiring substrate 1 of FIG. 1 is used.

By irradiating $CO_2$ laser or the like, holes (7b) for forming the via conductors 7 are formed penetrating the metal foil and the interlayer insulating layer 6. A seed layer (which will become the intermediate metal layer of the second laminated structure) is formed on inner walls of the holes (7b) and on the metal foil by electrolytic plating, sputtering, or the like. Then, on the seed layer, a plating resist (not illustrated in the drawings) having openings at appropriate positions is provided, and, by electrolytic plating using the seed layer as an electrode, conductor patterns of a conductor layer having the second laminated structure and via conductors 7 are respectively formed in the openings of the plating resist and in the holes (7b). The plating film formed by electrolytic plating forms the plating film layer (12c) of the second laminated structure. The plating resist (not illustrated in the drawings) is removed, and unwanted portions of the metal foil and the seed layer are removed by etching or the like.

A surface of the plating film layer (12c) of the second laminated structure can also have a certain degree of unevenness formed during film formation by electrolytic plating. However, in order to etch the surface of the plating film layer (12c), the etching for removing unwanted portions of the seed layer and the like is performed such that the plating film layer (12c) is exposed to an etching solution without covering the surface of the plating film layer (12c). That is, in order to reduce the unevenness and increase the smoothness of the surface of the plating film layer (12c), the surface of the plating film layer (12c) is subjected to etching. By etching the surface of the plating film layer (12c), the surface (on an opposite side with respect to the core layer 10) of each of the first and second intermediate conductor layers (31, 32) having the second laminated structure (the surface 121 on the plating film layer (12c) side) can have a smaller unevenness than the surface (on an opposite side with respect to the core layer 10) of each of the conductor layers having the first laminated structure (such as the first and second inner conductor layers (21, 22) in the example of FIG. 1).

Figure 6C:
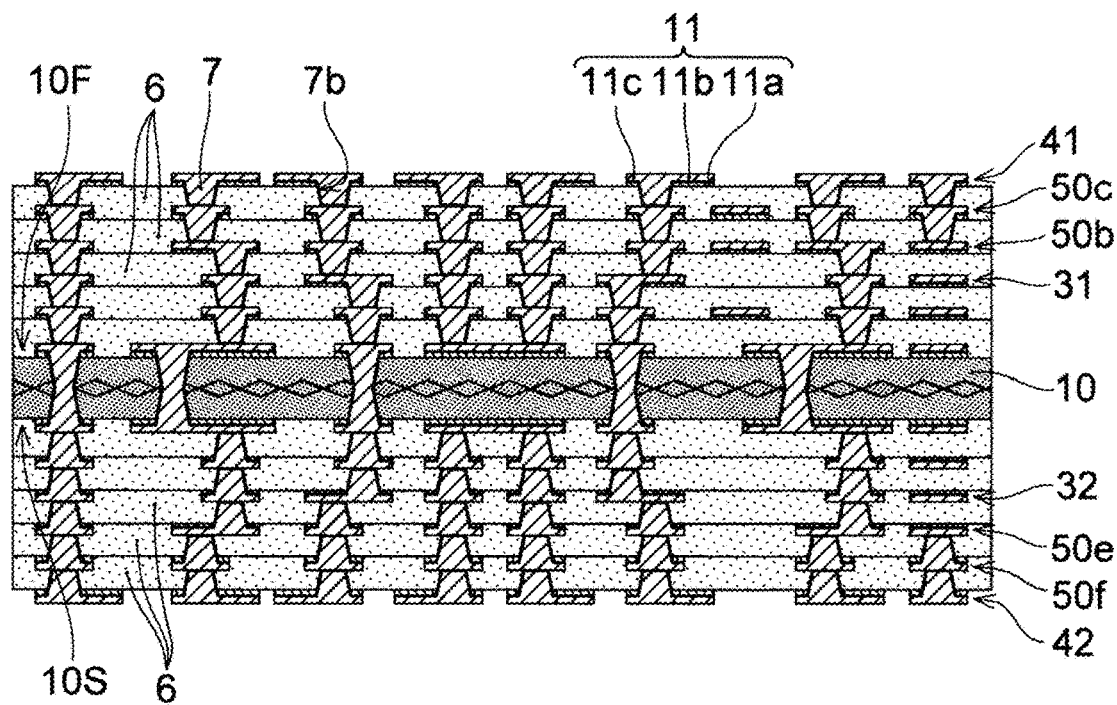
FIG. 6C is a cross-sectional view illustrating an example of a manufacturing process of the wiring substrate of the embodiment.

Further, as illustrated in FIG. 6C, on the first surface (10F) side of the core layer 10, the inner-layer conductor layers (50b, 50c) and the first outer conductor layer 41, and the interlayer insulating layers 6 are formed, and, on the second surface (10S), the inner-layer conductor layers (50e, 50f) and the second outer conductor layer 42, and the interlayer insulating layers 6 are formed. As described above with reference to FIG. 6B, the interlayer insulating layers 6 are each formed, for example, by thermocompression-bonding of a sheet-like prepreg and the like. The inner-layer conductor layers (50b, 50e) can be formed using the same method as the first and second intermediate conductor layers (31, 32) described above. A method of forming the inner-layer conductor layers (50c, 50f) is not particularly limited. In the example of FIG. 6C, the inner-layer conductor layers (50c, 50f) are formed using a subtractive method using a metal foil.

In manufacturing the wiring substrate 1 in the example of FIG. 1, the first and second outer conductor layers (41, 42) are formed to have the first laminated structure 11. An example of a method for forming the first and second outer conductor layers (41, 42) is a subtractive method using a metal foil. That is, on each of the already formed inner-layer conductor layers (50c, 50f), a metal foil (which will become the metal foil layer (11a) of the first laminated structure 11) is laminated together with a resin sheet (prepreg) (which will become an interlayer insulating layer 6). For this metal foil, a metal foil thicker than the metal foil used in forming the first and second intermediate conductor layers (31, 32) having the second laminated structure is used. Further, for the metal foil that will become the metal foil layer (11a), preferably, a metal foil is used of which a surface facing the core layer 10 side has a larger unevenness than a surface facing the core layer 10 side of the metal foil used in forming the first and second intermediate conductor layers (31, 32).

Holes (7b) for forming the via conductors 7 are formed in the metal foil layer (11a) and the interlayer insulating layer 6 below the metal foil layer (11a) by, for example, $CO_2$ laser irradiation. Subsequently, a seed layer (which will become the intermediate metal layer (11b) of the first laminated structure 11) is formed by electroless plating or the like in the holes (7b) and on the entire surface of the metal foil layer (11a). Further, by electroplating using the seed layer as an electrode, a plating film (which will become the plating film layer (11c) of the first laminated structure 11) is formed on the entire surface of the seed layer. As a result, the first and second outer conductor layers (41, 42) having the first laminated structure 11 are formed, and the via conductors 7 are formed in the holes (7b). Thereafter, the first and second outer conductor layers (41, 42) are patterned using a subtractive method.

Also in forming the first and second outer conductor layers (41, 42), the plating film layer (11c) of the first laminated structure 11 is not exposed to an etching solution during patterning using a subtractive method. Therefore, unevenness formed during film formation by electrolytic plating remains in the surface (on an opposite side with respect to the core layer 10) of each of the first and second outer conductor layers (41, 42) having the first laminated structure 11 in the wiring substrate 1 of FIG. 1. Therefore, as compared to the first and second outer conductor layers, each of the first and second intermediate conductor layers (31, 32) can have a smaller unevenness in a surface on an opposite side with respect to the core layer 10.

Thereafter, the solder resist layer 81 is formed on the first outer conductor layer 41, and the solder resist layer 82 is formed on the second outer conductor layer 42. The solder resist layers (81, 82) are each formed by, for example, forming a resin layer containing a photosensitive epoxy resin or polyimide resin or the like, and performing exposure and development using a mask having an appropriate pattern. Through the above processes, the wiring substrate 1 in the example of FIG. 1 is completed. When necessary, a surface protective film (not illustrated in the drawings) formed of Au, Ni/Au, Ni/Pd/Au, solder, heat resistant preflux, or the like may be formed by electroless plating, solder leveling, spray coating, or the like on the connection pads (4a) exposed from the openings of the solder resist layers (81, 82).

A method for forming a conductor layer having the first laminated structure 11 is not limited to a subtractive method as long as the conductor layer includes a metal foil layer and a plating film layer. Further, a method for forming a conductor layer having the second laminated structure 12 is not limited as long as the conductor layer includes a metal foil layer and a plating film layer, the metal foil layer being thinner than the metal foil layer included in the first laminated structure 11.

The wiring substrates of the embodiment are not limited to those having the structures illustrated in the drawings and those having the structures, shapes, and materials exemplified herein. For example, it is not always necessary to provide the through-hole conductors (10a) and the stacked via conductors 71. Further, it is also possible that the via conductors 7 do not each have a shape that is reduced in diameter toward the core layer 10 side. Further, it is not always necessary to provide the solder resist layers (81, 82).

In the multilayer wiring board of Japanese Patent Application Laid-Open Publication No. 2014-154631, all outer layers and inner layers of the wiring pattern layers are formed of plating films (mainly electrolytic plating films). For an inner-layer wiring pattern, there is a risk that a short circuit failure may occur between the inner-layer wiring pattern and a surface-layer side wiring pattern layer that is adjacent to the inner-layer wiring pattern via an interlayer resin insulating layer.

A wiring substrate according to an embodiment of the present invention includes: a core layer having a first surface and a second surface on an opposite side with respect to the first surface; a first inner conductor layer formed on the first surface; a second inner conductor layer formed on the second surface; a first outer conductor layer formed on an outermost layer on the first surface side; a second outer conductor layer formed on an outermost layer on the second surface side; a first intermediate conductor layer formed between the first inner conductor layer and the first outer conductor layer; a second intermediate conductor layer formed between the second inner conductor layer and the second outer conductor layer; and interlayer insulating layers respectively interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer. Then, at least one of each of the first and second inner conductor layers and each of the first and second outer conductor layers has a first laminated structure that includes at least a metal foil layer and a plating film layer, the metal foil layer having a predetermined thickness; the first intermediate conductor layer and the second intermediate conductor layer each have a second laminated structure that includes at least a metal foil layer and a plating film layer, the metal foil layer having a thickness smaller than the predetermined thickness; and a surface (on an opposite side with respect to the core layer) of a conductor layer having the second laminated structure has a smaller unevenness than a surface (on an opposite side with respect to the core layer) of a conductor layer having the first laminated structure.

According to an embodiment of the present invention, it is thought that a short circuit failure between layers in a multilayer board can be reduced, which can contribute to improvement in quality of the wiring substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
a core layer;
a plurality of first conductor layers formed on a first surface of the core layer and comprising a first inner conductor layer formed on the first surface of the core layer, a first outer conductor layer forming an outermost conductor layer on a first surface side of the core layer, and a first intermediate conductor layer formed between the first inner conductor layer and the first outer conductor layer;
a plurality of second conductor layers formed on a second surface of the core layer on an opposite side with respect to the first surface of the core layer and comprising a second inner conductor layer formed on the second surface of the core layer, a second outer conductor layer forming an outermost conductor layer on a second surface side of the core layer, and a second intermediate conductor layer formed between the second inner conductor layer and the second outer conductor layer; and
a plurality of interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer,
wherein at least one of the first and second inner conductor layers has a first laminated structure comprising a metal foil layer and a plating film layer, at least one of the first and second outer conductor layers has the first laminated structure, at least one of the first and second intermediate conductor layers has a second laminated structure comprising a metal foil layer and a plating film layer, the first and second laminated structures are formed such that a surface of the second laminated structure on a side away from the core layer has an unevenness that is smaller than an unevenness of a surface of the first laminated structure on a side away from the core layer, and each of the first and second intermediate conductor layers has the second laminated structure formed such that the metal foil layer of the second laminated structure has a thickness that is smaller than a thickness of the metal foil layer of the first laminated structure.

2. The wiring substrate according to claim 1, wherein the first and second laminated structures are formed such that a surface of the first laminated structure on a core layer side has an unevenness that is larger than an unevenness of a surface of the second laminated structure on a core layer side.

3. The wiring substrate according to claim 1, wherein the first and second laminated structures are formed such that the plating film layer in the first laminated structure has a thickness that is smaller than a thickness of the plating film layer in the second laminated structure.

4. The wiring substrate according to claim 1, wherein each of the first inner conductor layer, the second inner conductor layer, the first outer conductor layer, and the second outer conductor layer has the first laminated structure.

5. The wiring substrate according to claim 1, wherein the plurality of first conductor layers includes an inner-layer conductor layer formed between the first inner conductor layer and the first intermediate conductor layer such that the inner-layer conductor layer has one of the first laminated structure and the second laminated structure.

6. The wiring substrate according to claim 5, wherein the inner-layer conductor layer has the first laminated structure.

7. The wiring substrate according to claim 5, wherein the inner-layer conductor layer has the second laminated structure.

8. The wiring substrate according to claim 1, wherein the plurality of first conductor layers includes an inner-layer conductor layer formed between the first intermediate conductor layer and the first outer conductor layer such that the inner-layer conductor layer has one of the first laminated structure and the second laminated structure.

9. The wiring substrate according to claim 8, wherein the inner-layer conductor layer has the first laminated structure.

10. The wiring substrate according to claim 8, wherein the inner-layer conductor layer has the second laminated structure.

11. The wiring substrate according to claim 1, wherein the plurality of first conductor layers includes a first inner-layer conductor layer formed between the first inner conductor layer and the first intermediate conductor layer, the plurality of second conductor layers includes a second inner-layer conductor layer formed between the first intermediate conductor layer and the first outer conductor layer, and the first and second inner-layer conductor layers have one of the first laminated structure and the second laminated structure.

12. The wiring substrate according to claim 11, wherein the first and second inner-layer conductor layers have the first laminated structure.

13. The wiring substrate according to claim 11, wherein the first and second inner-layer conductor layers have the second laminated structure.

14. The wiring substrate according to claim 1, wherein the first and second laminated structures are formed such that a surface of the first laminated structure on a core layer side has an unevenness that is larger than an unevenness of a surface of the second laminated structure on a core layer side, the first and second laminated structures are formed such that the plating film layer in the first laminated structure has a thickness that is smaller than a thickness of the plating film layer in the second laminated structure, and each of the first inner conductor layer, the second inner conductor layer, the first outer conductor layer, and the second outer conductor layer has the first laminated structure.

15. The wiring substrate according to claim 2, wherein the first and second laminated structures are formed such that the plating film layer in the first laminated structure has a thickness that is smaller than a thickness of the plating film layer in the second laminated structure.

16. The wiring substrate according to claim 2, wherein each of the first inner conductor layer, the second inner conductor layer, the first outer conductor layer, and the second outer conductor layer has the first laminated structure.

17. The wiring substrate according to claim 2, wherein the plurality of first conductor layers includes an inner-layer conductor layer formed between the first inner conductor layer and the first intermediate conductor layer such that the inner-layer conductor layer has one of the first laminated structure and the second laminated structure.

18. The wiring substrate according to claim 2, wherein the plurality of first conductor layers includes an inner-layer conductor layer formed between the first intermediate conductor layer and the first outer conductor layer such that the inner-layer conductor layer has one of the first laminated structure and the second laminated structure.

19. The wiring substrate according to claim 2, wherein the plurality of first conductor layers includes a first inner-layer conductor layer formed between the first inner conductor layer and the first intermediate conductor layer, the plurality of second conductor layers includes a second inner-layer conductor layer formed between the first intermediate conductor layer and the first outer conductor layer, and the first and second inner-layer conductor layers have one of the first laminated structure and the second laminated structure.

20. The wiring substrate according to claim 3, wherein each of the first inner conductor layer, the second inner conductor layer, the first outer conductor layer, and the second outer conductor layer has the first laminated structure.

* * * * *